(12) United States Patent
Philipp et al.

(10) Patent No.: US 7,679,950 B2
(45) Date of Patent: Mar. 16, 2010

(54) INTEGRATED CIRCUIT HAVING A SWITCH

(75) Inventors: Jan Boris Philipp, Peekskill, NY (US); Thomas Happ, Tarrytown, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/210,372

(22) Filed: Aug. 24, 2005

(65) Prior Publication Data
US 2007/0045771 A1    Mar. 1, 2007

(51) Int. Cl.
G11C 11/00    (2006.01)
(52) U.S. Cl. .................. 365/163; 365/189.07; 365/148
(58) Field of Classification Search ................. 365/163, 365/189.07, 210, 148
See application file for complete search history.

(56) References Cited

U.S. PATENT DOCUMENTS

| | | | |
|---|---|---|---|
| 5,973,978 | A | 10/1999 | Cutter et al. |
| 6,692,994 | B2 | 2/2004 | Davis et al. |
| 6,937,507 | B2 * | 8/2005 | Chen ..................... 365/163 |
| 7,038,961 | B2 * | 5/2006 | Sakata et al. ............. 365/205 |
| 7,042,760 | B2 * | 5/2006 | Hwang et al. ............ 365/163 |
| 2003/0123207 | A1 | 7/2003 | Toyoshima |
| 2004/0125643 | A1 | 7/2004 | Kang et al. |
| 2004/0140523 | A1 | 7/2004 | Hudgens et al. |
| 2004/0202017 | A1 | 10/2004 | Lee |
| 2005/0047189 | A1 | 3/2005 | Thomas et al. |
| 2005/0151578 | A1 | 7/2005 | Huang et al. |

FOREIGN PATENT DOCUMENTS

WO    WO 01/45108    6/2001

OTHER PUBLICATIONS

Stefan Lai, Tyler Lowrey, "OUM—A 180 nm Nonvolatile Memory Cell Element Technology For Stand Alone and Embedded Applications", IEDM 2001. 4 pages.
Stefan Lai, "Current status of the phase change memory and its future", IEDM 2003. 4 pages.
H. Horii et al., "A Novel Cell Technology Using N-doped GeSbTe Films for Phase Change RAM", VLSI, 2003. 2 pages.
"A PROM Element Based on Salicide Agglomeration of Poly Fuses in a CMOS Logic Process", Mohsen Alavi, et al., 1997. (4 pgs.).

* cited by examiner

*Primary Examiner*—Richard Elms
*Assistant Examiner*—Nam Nguyen
(74) *Attorney, Agent, or Firm*—Dicke, Billig & Czaja, PLLC

(57) ABSTRACT

A reprogrammable switch includes first phase-change material, a reference element, and a sense amplifier. The sense amplifier is coupled to the first phase-change material and the reference element and configured to compare a signal from the first phase-change material to a signal from the reference element and output a voltage signal based on the comparison.

32 Claims, 3 Drawing Sheets

INTEGRATED CIRCUIT HAVING A SWITCH

BACKGROUND

Phase-change materials exhibit at least two different states. The states of phase-change material may be referenced to as amorphous and crystalline states. The states may be distinguished because the amorphous state generally exhibits higher resistivity than does the crystalline state. Generally, the amorphous state involves a more disordered atomic structure, while the crystalline state is an ordered lattice. Some phase-change materials exhibit two crystalline states, e.g. a face-centered cubic (FCC) state and a hexagonal closest packing (HCP) state. These two crystalline states have different resistivities. In the following description, the amorphous state generally refers to the state having the higher resistivity, and the crystalline state generally refers to the state having the lower resistivity.

Phase change in the phase-change materials may be induced reversibly. In this way, the phase-change material may change from the amorphous state to the crystalline state, and from the crystalline state to the amorphous state, in response to temperature changes. The temperature changes to the phase-change material may be achieved in a variety of ways. For example, a laser can be directed to the phase-change material, current may be driven through the phase-change material, or current can be fed through a resistive heater adjacent the phase-change material. With any of these methods, controllable heating of the phase-change material causes controllable phase change within the phase-change material.

Typically, semiconductor chips, such as memories, use fuses to configure the chip or deactivate failing portions of the chip. There are two types of fuses, laser fuses and e-fuses. Laser fuses are opened with a laser and e-fuses are opened with an electrical pulse. Alternatively, electrical antifuses can be used in place of fuses. Antifuses break down a thin dielectric to provide a current path. These solutions use a significant amount of chip space and are therefore costly to implement. Laser fuses are limited by the laser focus spot size and e-fuses and antifuses are limited by minimum size requirements for reliable operation. In addition, these fuses and antifuses are only one time programmable (OTP).

SUMMARY

One embodiment of the present invention provides a reprogrammable switch. The reprogrammable switch includes first phase-change material, a reference element, and a sense amplifier. The sense amplifier is coupled to the first phase-change material and the reference element and configured to compare a signal from the first phase-change material to a signal from the reference element and output a voltage signal based on the comparison.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
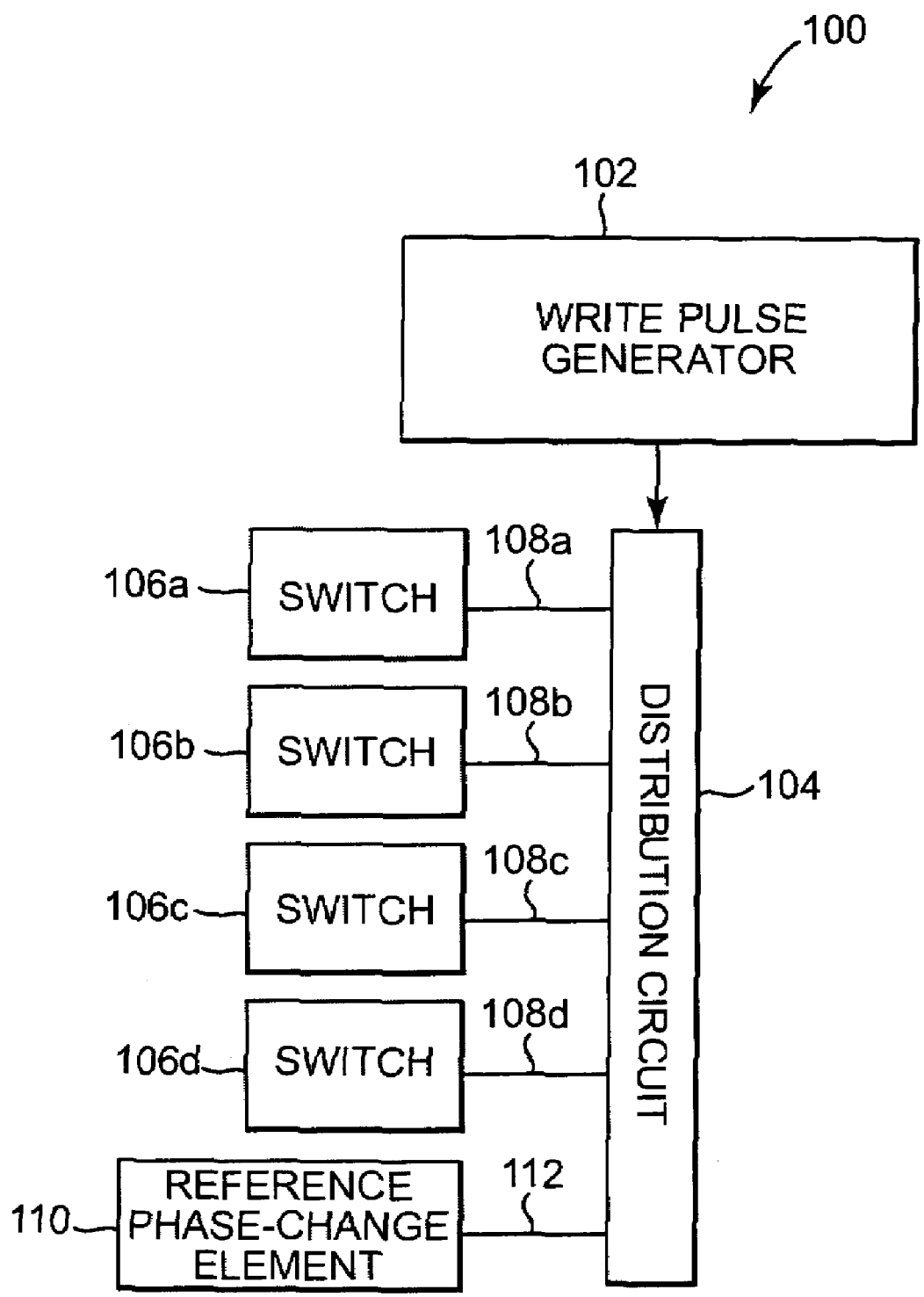
FIG. 1 is block diagram illustrating one embodiment of a device including reprogrammable phase-change material switches.

FIG. 1 illustrates a block diagram of one embodiment of a device 100 including reprogrammable phase-change material switches. Device 100 includes a write pulse generator 102, a distribution circuit 104, reprogrammable switches 106a, 106b, 106c, and 106d, and optional reference phase-change element 110. In one embodiment, reprogrammable switches 106a-106d are phase-change material switches that are based on the amorphous to crystalline phase transition of the phase-change material.

Each reprogrammable switch 106a-106d includes phase-change material. The reprogrammable switches 106a-106d can also be used in place of fuses or antifuses to configure or deactivate part of a chip. The amorphous or crystalline state of the phase-change material of each reprogrammable switch 106a-106d determines whether the switch is open (not conducting) or closed (conducting). In one embodiment, a comparison of the resistance of the phase-change material in each reprogrammable switch 106a-106d with the resistance of reference phase-change element 110 determines whether the switch is open or closed.

In one embodiment, write pulse generator 102 is an internal write pulse generator that is part of the same chip as distribution circuit 104 and reprogrammable switches 106a-106d. In this embodiment, reprogrammable switches 106a-106d can be programmed by write pulse generator 102 at any time throughout the life of the device. In another embodiment, write pulse generator 102 is an external write pulse generator that is not part of the same chip as distribution circuit 104 and reprogrammable switches 106a-106d. In this embodiment, an external write pulse generator 102 is temporarily coupled to distribution circuit 104 to program reprogrammable switches 106a-106d. This allows for programming or configuration of the chip during manufacturing that cannot be changed later by the user. Such one-time programming can be used for additional security features such as serial numbers, encryption codes, etc.

In one embodiment, write pulse generator 102 generates current or voltage pulses that are controllably directed to reprogrammable phase-change material switches 106a-106d via distribution circuit 104 to program the reprogrammable phase-change material switches 106a-106d. In one embodiment, distribution circuit 104 includes a plurality of transistors that controllably direct current or voltage pulses to the reprogrammable phase-change material switches through signal paths 108a-108d and to optional reference phase-change element 110 through signal path 112.

In one embodiment, reprogrammable switches 106a-106d and optional reference phase-change element 110 include phase-change material that may be changed from an amorphous state to a crystalline state or from a crystalline state to an amorphous state under influence of temperature change. The degree of crystallinity thereby defines at least two states for opening or closing the switch within device 100. The at least two states can be assigned to the switch "off" and switch "on" states or the fuse "open" and fuse "closed" states. The switch "off" and "on" states or the fuse "open" and "closed" states of reprogrammable phase-change material switches 106a-106d differ significantly in their electrical resistivity. In the amorphous state, a phase-change material exhibits significantly higher resistivity than in the crystalline state.

To program a reprogrammable phase-change material switch 106a-106d within device 100, write pulse generator 102 generates a current or voltage pulse for heating the phase-change material in the target reprogrammable phase-change material switch. In one embodiment, write pulse generator 102 generates an appropriate current or voltage pulse, which is fed into distribution circuit 104 and distributed to the appropriate target reprogrammable phase-change material switch 106a-106d through signal path 108a-108d. The current or voltage pulse amplitude and duration is controlled depending on whether the reprogrammable phase-change material switch is being turned on or off. Generally, a "set" operation of a reprogrammable phase-change material switch is heating the phase-change material of the target reprogrammable phase-change material switch above its crystallization temperature (but below its melting temperature) long enough to achieve the crystalline state. Generally, a "reset" operation of a reprogrammable phase-change material switch is heating the phase-change material of the target reprogrammable phase-change material switch above its melting temperature, and then quickly quench cooling the phase-change material, thereby achieving the amorphous state. Reference phase-change element 110 is set and reset similarly to reprogrammable switches 106a-106d through signal path 112.

Figure 2:
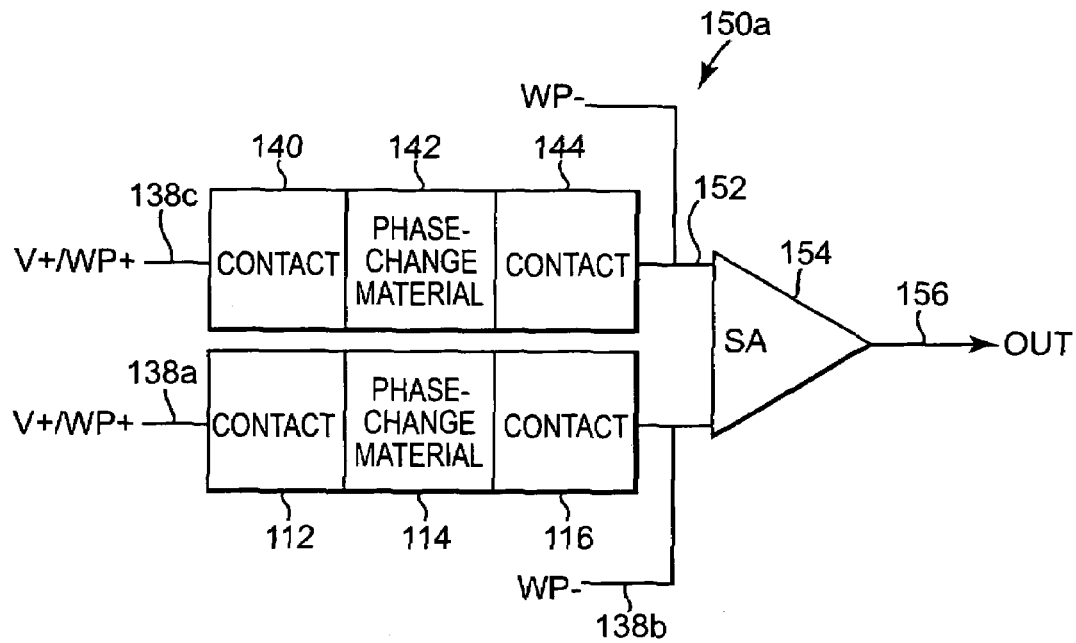
FIG. 2 illustrates one embodiment of a reprogrammable phase-change material switch.

FIG. 2 illustrates one embodiment of a reprogrammable phase-change material switch 150a. Reprogrammable phase-change material switch 150a includes first contact 112, first phase-change material 114, second contact 116, third contact 140, second phase-change material 142, fourth contact 144, and a sense amplifier (SA) 154. First contact 112 receives a constant voltage (V+) or one side of a write pulse (WP+) signal on V+/WP+ signal path 138a. First contact 112 is electrically coupled to first phase-change material 114. First phase-change material 114 is electrically coupled to second contact 116. Second contact 116 is electrically coupled to an input of sense amplifier 154 through the other side of the write pulse (WP−) signal path 138b. Third contact 140 receives a constant voltage (V+) or one side of a write pulse (WP+) signal on V+/WP+ signal path 138c. Third contact 140 is electrically coupled to second phase-change material 142. Second phase-change material 142 is electrically coupled to fourth contact 144. Fourth contact 144 is electrically coupled to another input of sense amplifier 154 through the other side of the write pulse (WP−) signal path 152. Sense amplifier 154 provides the out (OUT) signal on OUT signal path 156.

First phase-change material 114 and second phase-change material 142 may be made up of a variety of materials in accordance with the present invention. Generally, chalcogenide alloys that contain one or more elements from group VI of the periodic table are useful as such materials. In one embodiment, first phase-change material 114 and second phase-change material 142 of reprogrammable phase-change material switch 150a are made up of a chalcogenide compound material, such as GeSbTe, SbTe, or AgInSbTe. In another embodiment, the phase-change material can be chalcogen free, such as GeSb, GaSb, or GeGaSb.

During programming of first phase-change material 114 of reprogrammable phase-change material switch 150a, write pulse generator 102 is selectively coupled across first contact 112 and second contact 116. Write pulse generator 102 controls the application of a current and/or voltage write pulse from first contact 112 through V+/WP+ signal path 138a to second contact 116 through WP− signal path 138b, and thus to first phase-change material 114, to set or reset first phase-change material 114. During a set operation of first phase-change material 114, a set current and/or voltage pulse is selectively enabled by write pulse generator 102 and sent through first contact 112 to first phase-change material 114 thereby heating first phase-change material 114 above its crystallization temperature (but usually below its melting temperature). In this way, first phase-change material 114 reaches its crystalline state during this set operation. During a reset operation of first phase-change material 114, a reset current and/or voltage pulse is selectively enabled by write pulse generator 102 and sent through first contact 112 to first phase-change material 114. The reset current or voltage quickly heats first phase-change material 114 above its melting temperature. After the current and/or voltage pulse is turned off, first phase-change material 114 quickly quench cools into the amorphous state.

During programming of second phase-change material 142 of reprogrammable phase-change material switch 150a, write pulse generator 102 is selectively coupled across third contact 140 and fourth contact 144. Write pulse generator 102 controls the application of a current and/or voltage write pulse from third contact 140 through V+/WP+ signal path 138c to fourth contact 144 through WP− signal path 152, and thus to second phase-change material 142, to set or reset second phase-change material 142. During a set operation of second phase-change material 142, a set current and/or voltage pulse is selectively enabled by write pulse generator 102 and sent through third contact 140 to second phase-change material 142 thereby heating second phase-change material 142 above its crystallization temperature (but usually below its melting temperature). In this way, second phase-change material 142 reaches its crystalline state during this set operation. During a reset operation of second phase-change material 142, a reset current and/or voltage pulse is selectively enabled by write pulse generator 102 and sent through third contact 140 to second phase-change material 142. The reset current or voltage quickly heats second phase-change material 142 above its melting temperature. After the current and/or voltage pulse is turned off, second phase-change material 142 quickly quench cools into the amorphous state.

In one embodiment, second phase-change material 142 provides a fixed reference, such as reference phase-change element 110, to compare to first phase-change material 114. In one embodiment, second phase-change material 142 is programmed once at device fabrication. In one embodiment, second phase-change material 142 provides a fixed reference for more than one reprogrammable phase-change material switch 150a. During operation of reprogrammable phase-change material switch 150a, the constant voltage V+ is selectively applied to first contact 112 through V+/WP+ signal path 138a and the constant voltage V+ is applied to third contact 140 through V+/WP+ signal path 138c. With the constant voltage V+ applied to first contact 112 and the constant voltage V+ applied to third contact 140, sense amplifier 154 compares the current on signal path 152 to the current on signal path 138b. If first phase-change material 114 is in the amorphous state and second phase-change material 142 is in the crystalline state, or if the resistance of first phase-change material 114 is significantly greater than the resistance of second phase-change material 142, then the current through first phase-change material 114 is small compared to the current through second phase-change material 142. Therefore, the current on signal path 138b is less than the current on signal path 152. In response to the current on signal path 138b being less than the current on signal path 152, sense amplifier 154 outputs a high voltage level signal on OUT signal path 156 turning on reprogrammable phase-change material switch 150a.

If first phase-change material 114 is in the crystalline state and second phase-change material 142 is in the amorphous state, or if the resistance of first phase-change material 114 is significantly less than the resistance of second phase-change material 142, then the current through first phase-change material 114 is large compared to the current through second phase-change material 142. Therefore, the current on signal path 138*b* is greater than the current on signal path 152. In response to the current on signal path 138*b* being greater than the current on signal path 152, sense amplifier 154 outputs a low voltage level signal or ground signal on OUT signal path 156 turning off reprogrammable phase-change material switch 150*a*. In another embodiment, the voltage levels output by sense amplifier 154 based on the states of first phase-change material 114 and second phase-change material 142 are reversed.

Figure 3:
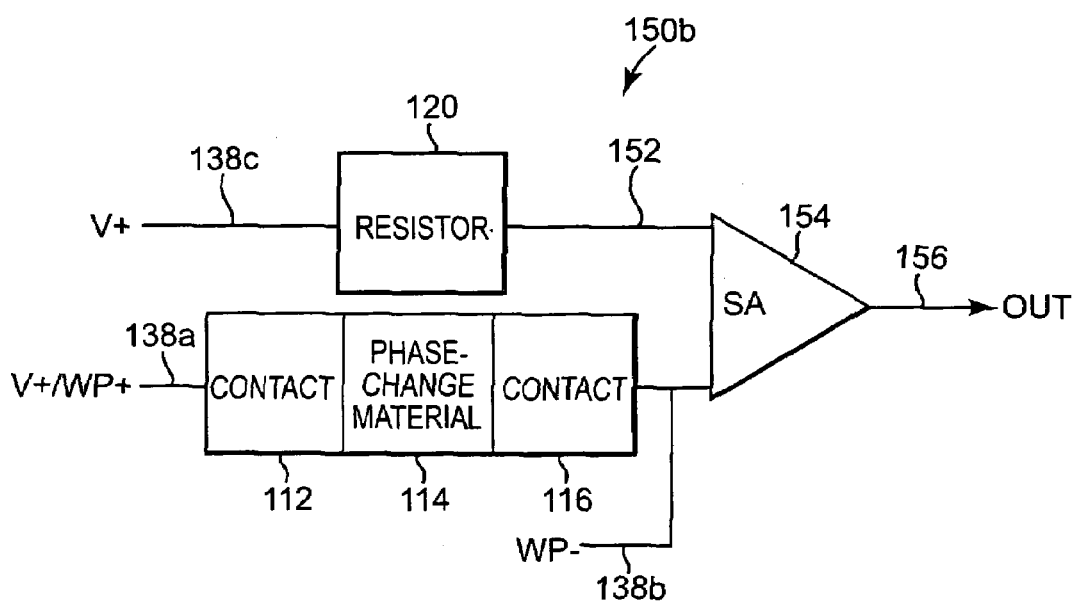
FIG. 3 illustrates another embodiment of a reprogrammable phase-change material switch.

FIG. 3 illustrates another embodiment of a reprogrammable phase-change material switch 150*b*. Reprogrammable phase-change material switch 150*b* is similar to reprogrammable phase-change material switch 150*a* except third contact 140, second phase-change material 142, and fourth contact 144 are replaced by resistor 120, which is a reference element. Resistor 120 receives the constant voltage (V+) on V+ signal path 138*c*. Resistor 120 is electrically coupled to an input of sense amplifier 154 through signal path 152. First contact 112 receives the constant voltage (V+) or one side of a write pulse (WP+) signal on V+/WP+ signal path 138*a*. First contact 112 is electrically coupled to phase-change material 114. Phase-change material 114 is electrically coupled to second contact 116. Second contact 116 is electrically coupled to another input of sense amplifier 154 through the other side of the write pulse (WP−) signal path 138*b*.

During programming of phase-change material 114 of reprogrammable phase-change material switch 150*b*, write pulse generator 102 is selectively coupled across first contact 112 and second contact 116. Write pulse generator 102 controls the application of a current and/or voltage write pulse from first contact 112 through V+/WP+ signal path 138*a* to second contact 116 through WP− signal path 138*b*, and thus to phase-change material 114, to set or reset phase-change material 114. During a set operation of phase-change material 114, a set current and/or voltage pulse is selectively enabled by write pulse generator 102 and sent through first contact 112 to phase-change material 114 thereby heating phase-change material 114 above its crystallization temperature (but usually below its melting temperature). In this way, phase-change material 114 reaches its crystalline state during this set operation. During a reset operation of phase-change material 114, a reset current and/or voltage pulse is selectively enabled by write pulse generator 102 and sent through first contact 112 to phase-change material 114. The reset current or voltage quickly heats phase-change material 114 above its melting temperature. After the current and/or voltage pulse is turned off, phase-change material 114 quickly quench cools into the amorphous state.

In one embodiment, resistor 120 provides a fixed reference to compare to phase-change material 114. In one embodiment, resistor 120 provides a fixed reference for more than one reprogrammable phase-change material switch 150*b*. During operation of reprogrammable phase-change material switch 150*b*, the constant voltage V+ is selectively applied to first contact 112 through V+/WP+ signal path 138*a* and the constant voltage V+ is applied to resistor 120 through V+ signal path 138*c*. With the constant voltage V+ applied to first contact 112 and the constant voltage V+ applied to resistor 120, sense amplifier 154 compares the current on signal path 152 to the current on signal path 138*b*. If phase-change material 114 is in the crystalline state, or if the resistance of phase-change material 114 is significantly less than the resistance of resistor 120, then the current through phase-change material 114 is large compared to the current through resistor 120. Therefore, the current on signal path 138*b* is greater than the current on signal path 152. In response to the current on signal path 138*b* being greater than the current on signal path 152, sense amplifier 154 outputs a high voltage level signal on OUT signal path 156 turning on reprogrammable phase-change material switch 150*b*.

If phase-change material 114 is in the amorphous state, or if the resistance of phase-change material 114 is significantly greater than the resistance of resistor 120, then the current through phase-change material 114 is small compared to the current through resistor 120. Therefore, the current on signal path 138*b* is less than the current on signal path 152. In response to the current on signal path 138*b* being less than the current on signal path 152, sense amplifier 154 outputs a low voltage level signal or ground signal on OUT signal path 156 turning off reprogrammable phase-change material switch 150*b*. In another embodiment, the voltage levels output by sense amplifier 154 based on the state of phase-change material 114 and the resistance of resistor 120 are reversed.

Figure 4:
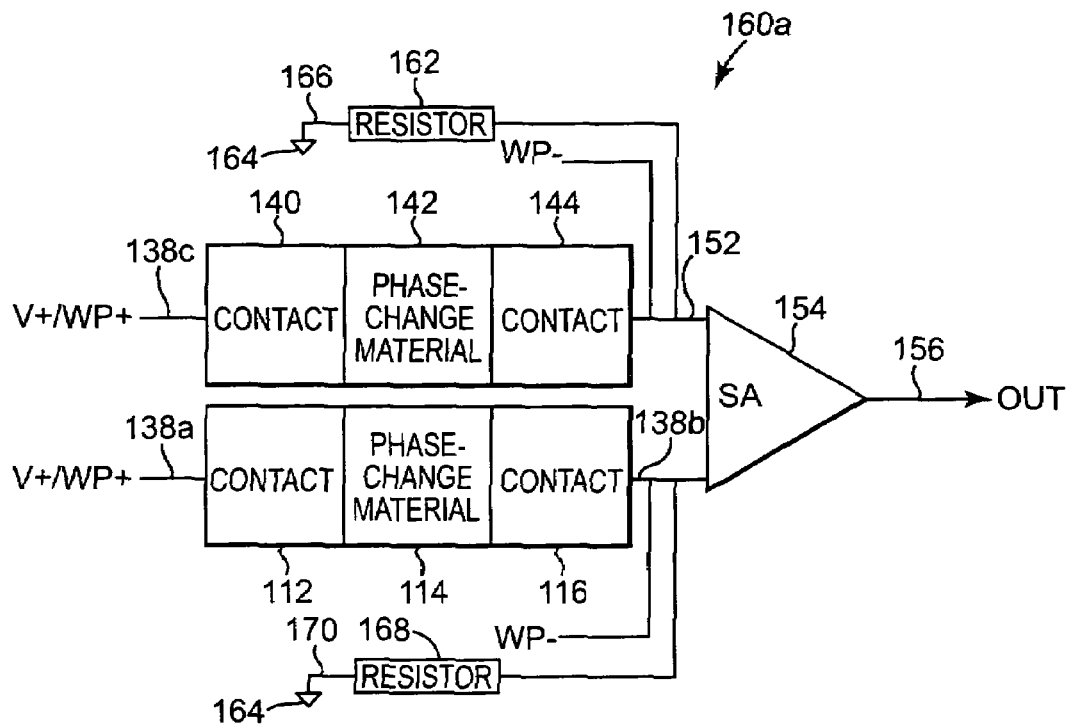
FIG. 4 illustrates another embodiment of a reprogrammable phase-change material switch.

FIG. 4 illustrates another embodiment of a reprogrammable phase-change material switch 160*a*. Reprogrammable phase-change material switch 160*a* includes first contact 112, first phase-change material 114, second contact 116, third contact 140, second phase-change material 142, fourth contact 144, resistor 162, resistor 168, and a sense amplifier (SA) 154. In one embodiment, the resistance of resistor 162 is approximately equal to the resistance of resistor 168. First contact 112 receives a constant voltage (V+) or one side of a write pulse (WP+) signal on V+/WP+ signal path 138*a*. First contact 112 is electrically coupled to first phase-change material 114. First phase-change material 114 is electrically coupled to second contact 116. Second contact 116 is electrically coupled to an input of sense amplifier 154 and one side of resistor 168 through the other side of the write pulse (WP−) signal path 138*b*. The other side of resistor 168 is electrically coupled to common or ground 164 through signal path 170. Third contact 140 receives a constant voltage (V+) or one side of a write pulse (WP+) signal on V+/WP+ signal path 138*c*. Third contact 140 is electrically coupled to second phase-change material 142. Second phase-change material 142 is electrically coupled to fourth contact 144. Fourth contact 144 is electrically coupled to another input of sense amplifier 154 and one side of resistor 162 through the other side of write pulse (WP−) signal path 152. The other side of resistor 162 is electrically coupled to common or ground 164 through signal path 166. Sense amplifier 154 provides the out (OUT) signal on OUT signal path 156.

During programming of first phase-change material 114 of reprogrammable phase-change material switch 160*a*, write pulse generator 102 is selectively coupled across first contact 112 and second contact 116. Write pulse generator 102 controls the application of a current and/or voltage write pulse from first contact 112 through V+/WP+ signal path 138*a* to second contact 116 through WP− signal path 138*b*, and thus to first phase-change material 114, to set or reset first phase-change material 114. During a set operation of first phase-change material 114, a set current and/or voltage pulse is selectively enabled by write pulse generator 102 and sent through first contact 112 to first phase-change material 114 thereby heating first phase-change material 114 above its crystallization temperature (but usually below its melting temperature). In this way, first phase-change material 114 reaches its crystalline state during this set operation. During a reset operation of first phase-change material 114, a reset current and/or voltage pulse is selectively enabled by write pulse generator 102 and sent through first contact 112 to first phase-change material 114. The reset current or voltage quickly heats first phase-change material 114 above its melting temperature. After the current and/or voltage pulse is turned off, first phase-change material 114 quickly quench cools into the amorphous state.

During programming of second phase-change material 142 of reprogrammable phase-change material switch 160a, write pulse generator 102 is selectively coupled across third contact 140 and fourth contact 144. Write pulse generator 102 controls the application of a current and/or voltage write pulse from third contact 140 through V+/WP+ signal path 138c to fourth contact 144 through WP− signal path 152, and thus to second phase-change material 142, to set or reset second phase-change material 142. During a set operation of second phase-change material 142, a set current and/or voltage pulse is selectively enabled by write pulse generator 102 and sent through third contact 140 to second phase-change material 142 thereby heating second phase-change material 142 above its crystallization temperature (but usually below its melting temperature). In this way, second phase-change material 142 reaches its crystalline state during this set operation. During a reset operation of second phase-change material 142, a reset current and/or voltage pulse is selectively enabled by write pulse generator 102 and sent through third contact 140 to second phase-change material 142. The reset current or voltage quickly heats second phase-change material 142 above its melting temperature. After the current and/or voltage pulse is turned off, second phase-change material 142 quickly quench cools into the amorphous state.

In one embodiment, second phase-change material 142 provides a fixed reference, such as reference phase-change element 110, to compare to first phase-change material 114. In one embodiment, second phase-change material 142 is programmed once at device fabrication. In one embodiment, second phase-change material 142 provides a fixed reference for more than one reprogrammable phase-change material switch 160a. During operation of reprogrammable phase-change material switch 160a, the constant voltage V+ is selectively applied to first contact 112 through V+/WP+ signal path 138a and the constant voltage V+ is applied to third contact 140 through V+/WP+ signal path 138c. With the constant voltage V+ applied to first contact 112, a voltage divider is formed by first phase-change material 114 and resistor 168. With the constant voltage V+ applied to third contact 140, a voltage divider is formed by second phase-change material 142 and resistor 162. Sense amplifier 154 compares the voltage on signal path 152 to the voltage on signal path 138b. If first phase-change material 114 is in the amorphous state and second phase-change material 142 is in the crystalline state, or if the resistance of first phase-change material 114 is significantly greater than the resistance of second phase-change material 142, then the voltage drop across first phase-change material 114 is large compared to the voltage drop across second phase-change material 142. Therefore, the voltage on signal path 138b is less than the voltage on signal path 152. In response to the voltage on signal path 138b being less than the voltage on signal path 152, sense amplifier 154 outputs a high voltage level signal on OUT signal path 156 turning on reprogrammable phase-change material switch 160a.

If first phase-change material 114 is in the crystalline state and second phase-change material 142 is in the amorphous state, or if the resistance of first phase-change material 114 is significantly less than the resistance of second phase-change material 142, then the voltage drop across first phase-change material 114 is small compared to the voltage drop across second phase-change material 142. Therefore, the voltage on signal path 138b is greater than the voltage on signal path 152. In response to the voltage on signal path 138b being greater than the voltage on signal path 152, sense amplifier 154 outputs a low voltage level signal or ground signal on OUT signal path 156 turning off reprogrammable phase-change material switch 160a. In another embodiment, the voltage levels output by sense amplifier 154 based on the states of first phase-change material 114 and second phase-change material 142 are reversed.

Figure 5:
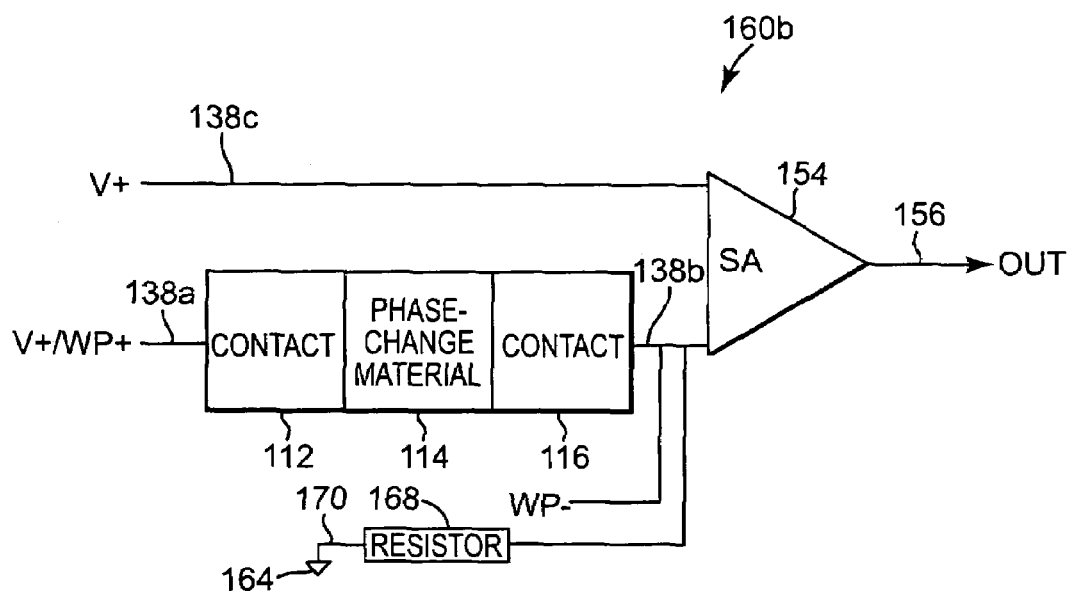
FIG. 5 illustrates another embodiment of a reprogrammable phase-change material switch.

FIG. 5 illustrates another embodiment of a reprogrammable phase-change material switch 160b. Reprogrammable phase-change material switch 160b is similar to reprogrammable phase-change material switch 160a except third contact 140, second phase-change material 142, fourth contact 144, and resistor 162 are removed. An input of sense amplifier 154 receives the constant voltage (V+) on V+ signal path 138c. First contact 112 receives the constant voltage (V+) or one side of a write pulse (WP+) signal on V+/WP+ signal path 138a. First contact 112 is electrically coupled to phase-change material 114. Phase-change material 114 is electrically coupled to second contact 116. Second contact 116 is electrically coupled to another input of sense amplifier 154 and one side of resistor 168 through the other side of the write pulse (WP−) signal path 138b. The other side of resistor 168 is electrically coupled to common or ground 164 through signal path 170.

During programming of phase-change material 114 of reprogrammable phase-change material switch 160b, write pulse generator 102 is selectively coupled across first contact 112 and second contact 116. Write pulse generator 102 controls the application of a current and/or voltage write pulse from first contact 112 through V+/WP+ signal path 138a to second contact 116 through WP− signal path 138b, and thus to phase-change material 114, to set or reset phase-change material 114. During a set operation of phase-change material 114, a set current and/or voltage pulse is selectively enabled by write pulse generator 102 and sent through first contact 112 to phase-change material 114 thereby heating phase-change material 114 above its crystallization temperature (but usually below its melting temperature). In this way, phase-change material 114 reaches its crystalline state during this set operation. During a reset operation of phase-change material 114, a reset current and/or voltage pulse is selectively enabled by write pulse generator 102 and sent through first contact 112 to phase-change material 114. The reset current or voltage quickly heats phase-change material 114 above its melting temperature. After the current and/or voltage pulse is turned off, phase-change material 114 quickly quench cools into the amorphous state.

The constant voltage V+ on signal path 138c provides a fixed reference voltage to compare to the voltage drop across phase-change material 114. During operation of reprogrammable phase-change material switch 160b, the constant voltage V+ is selectively applied to first contact 112 through V+/WP+ signal path 138a and the constant voltage V+ is applied to an input of sense amplifier 154 through signal path 138c. With the constant voltage V+ applied to first contact 112, a voltage divider is formed by first phase-change material 114 and resistor 168. With the constant voltage V+ applied to an input of sense amplifier 154, sense amplifier 154 compares the voltage on signal path 138c to the voltage on signal path 138b. If phase-change material 114 is in the crystalline state, then the voltage drop across phase-change material 114 is small. Therefore, the voltage on signal path 138b is approximately equal to the voltage on signal path 138c. In response to the voltage on signal path 138b being approximately equal to the voltage on signal path 138c, sense amplifier 154 outputs a high voltage level signal on OUT signal path 156 turning on reprogrammable phase-change material switch 160b.

If phase-change material 114 is in the amorphous state, then the voltage drop across phase-change material 114 is large. Therefore, the voltage on signal path 138b is less than the voltage on signal path 138c. In response to the voltage on signal path 138b being less than the voltage on signal path 138c, sense amplifier 154 outputs a low voltage level signal or ground signal on OUT signal path 156 turning off reprogrammable phase-change material switch 160b. In another embodiment, the voltage levels output by sense amplifier 154 based on the state of phase-change material 114 are reversed.

Embodiments of the present invention provide a reprogrammable switch, which can also be used as a fuse or antifuse using phase-change material. The resistivity of the phase-change material determines whether the switch is on or off or if used as a fuse or antifuse, whether the fuse or antifuse is open or closed. The switches are reprogrammable and use a small amount of space on a semiconductor chip compared to laser fuses and e-fuses. In addition, for phase-change memories, the reprogrammable switches can be fabricated simultaneously with the memory cells further reducing the cost.

What is claimed is:

1. An integrated circuit having a switch comprising:
   first resistivity changing material;
   a reference element; and
   a sense amplifier coupled to the first resistivity changing material and the reference element and configured to compare a signal from the first resistivity changing material to a signal from the reference element and output a voltage signal for deactivating a failing portion of the integrated circuit based on the comparison.

2. The integrated circuit of claim 1, wherein the reference element comprises a resistor.

3. The integrated circuit of claim 2, wherein the first resistivity changing material is selectively coupled to one of a constant voltage and a write pulse generator, and wherein the resistor is coupled to the constant voltage.

4. The integrated circuit of claim 1, wherein the reference element comprises second resistivity changing material.

5. The integrated circuit of claim 4, wherein the first resistivity changing material is selectively coupled to one of a constant voltage and a write pulse generator, and wherein the second resistivity changing material is selectively coupled to one of the constant voltage and the write pulse generator.

6. The integrated circuit of claim 3, wherein the write pulse generator comprises an internal write pulse generator.

7. The integrated circuit of claim 3, wherein the write pulse generator comprises an external write pulse generator.

8. A reprogrammable switch comprising:
   first phase-change material;
   second phase-change material; and
   a sense amplifier coupled to the first phase-change material and the second phase-change material and configured to compare a signal from the first phase-change material to a signal from the second phase-change material and output a voltage signal based on the comparison for deactivating a failing portion of a chip.

9. The switch of claim 8, wherein the first phase-change material is selectively coupled to one of a constant voltage and a write pulse generator, and wherein the second phase-change material is selectively coupled to one of the constant voltage and the write pulse generator.

10. The switch of claim 9, wherein the write pulse generator comprises an internal write pulse generator.

11. The switch of claim 9, wherein the write pulse generator comprises an external write pulse generator.

12. The switch of claim 8, wherein the sense amplifier is configured to compare a current through the first phase-change material to a current through the second phase-change material.

13. The switch of claim 8, wherein the sense amplifier is configured to compare a voltage across the first phase-change material to a voltage across the second phase-change material.

14. An integrated circuit chip comprising:
   a reprogrammable switch comprising a first contact, a second contact, and phase-change material between the first contact and the second contact; and
   means for deactivating a failing portion of the chip based on a state of the phase-change material and a state of a reference element.

15. The integrated circuit chip of claim 14, wherein the phase-change material comprises a chalcogenide.

16. The integrated circuit chip of claim 14, wherein the phase-change material comprises a chalcogen free material.

17. A method for using a reprogrammable switch, the method comprising:
   applying a write pulse to first phase-change material to switch a state of the first phase-change material;
   applying a first voltage to the first phase-change material and to a reference element;
   sensing a first signal from the first phase-change material and a second signal from the reference element;
   comparing the first signal to the second signal;
   providing a second voltage based on the comparison; and
   deactivating a failing portion of an integrated circuit based on the second voltage.

18. The method of claim 17, wherein applying the first voltage to the reference element comprises applying the first voltage to second phase-change material.

19. The method of claim 17, wherein applying the first voltage to the reference element comprises applying the first voltage to a resistor.

20. The method of claim 17, wherein applying the write pulse comprises applying the write pulse from an internal write pulse generator.

21. The method of claim 17, wherein applying the write pulse comprises applying the write pulse from an external write pulse generator.

22. A method for using a reprogrammable switch, the method comprising:
   applying a write pulse to first phase-change material to switch a state of the first phase-change material;
   applying a first voltage to the first phase-change material and to a second phase-change material;
   sensing a first signal from the first phase-change material and a second signal from the second phase-change material;
   comparing the first signal to the second signal;
   providing a second voltage based on the comparison; and
   deactivating a failing portion of a chip in response to the second voltage.

23. The method of claim 22, wherein applying the write pulse comprises applying the write pulse from an internal write pulse generator.

24. The method of claim 22, wherein applying the write pulse comprises applying the write pulse from an external write pulse generator.

25. The method of claim 22, wherein sensing the first signal from the first phase-change material and the second signal from the second phase-change material comprises sensing a first current through the first phase-change material and a second current through the second phase-change material.

26. The method of claim 22, wherein sensing the first signal from the first phase-change material and the second signal from the second phase-change material comprises sensing a third voltage across the first phase-change material and a fourth voltage across the second phase-change material.

27. The method of claim 22, further comprising:
applying a write pulse to the second phase-change material to switch a state of the second phase-change material.

28. A reprogrammable switch comprising:
phase-change material; and
a sense amplifier coupled to the phase-change material and a constant voltage, the sense amplifier configured to compare a voltage across the phase-change material to the constant voltage and output a voltage signal for deactivating a failing portion of an integrated circuit based on the comparison.

29. The switch of claim 28, wherein the phase-change material is selectively coupled to one of the constant voltage and a write pulse generator.

30. The switch of claim 28, wherein the write pulse generator comprises an internal write pulse generator.

31. The switch of claim 28, wherein the write pulse generator comprises an external write pulse generator.

32. An integrated circuit chip comprising:
a switch comprising resistivity changing material;
a reference element; and
a sense amplifier coupled to the switch and providing an output signal based on a state of the switch for deactivating a failing portion of the chip,
wherein the sense amplifier compares a signal provided by the reference element and provides the output signal based on the comparison.

* * * * *